(12) United States Patent
Henson et al.

(10) Patent No.: US 11,626,357 B2
(45) Date of Patent: Apr. 11, 2023

(54) 3D ELECTRICAL INTEGRATION USING COMPONENT CARRIER EDGE CONNECTIONS TO A 2D CONTACT ARRAY

(71) Applicant: FormFactor, Inc., Livermore, CA (US)

(72) Inventors: Roy J. Henson, Pleasanton, CA (US); Shawn O. Powell, Pleasant Hill, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/333,890

(22) Filed: May 28, 2021

(65) Prior Publication Data

US 2021/0375733 A1 Dec. 2, 2021

Related U.S. Application Data

(60) Provisional application No. 63/032,107, filed on May 29, 2020.

(51) Int. Cl.
| | |
|---|---|
| *H01L 23/498* | (2006.01) |
| *H01L 25/065* | (2023.01) |
| *H01L 23/13* | (2006.01) |
| *H01L 23/538* | (2006.01) |
| *H05K 1/18* | (2006.01) |
| *H01R 12/52* | (2011.01) |

(52) U.S. Cl.
CPC ........ *H01L 23/49805* (2013.01); *H01L 23/13* (2013.01); *H01L 23/5384* (2013.01); *H01L 23/5385* (2013.01); *H01L 25/0652* (2013.01); *H01R 12/523* (2013.01); *H05K 1/181* (2013.01); *H05K 2201/10378* (2013.01); *H05K 2201/10454* (2013.01); *H05K 2201/10522* (2013.01); *H05K 2201/10734* (2013.01)

(58) Field of Classification Search
CPC ............... H01L 23/49805; H01L 23/13; H01L 23/5384; H01L 23/5385; H01L 25/0652; H01R 12/523; H05K 1/181; H05K 2201/10378
USPC .......................................................... 361/768
See application file for complete search history.

(56) References Cited

U.S. PATENT DOCUMENTS

| | | | | |
|---|---|---|---|---|
| 5,036,428 | A * | 7/1991 | Brownhill | ............ H05K 7/1404 361/752 |
| 5,652,463 | A * | 7/1997 | Weber | ................. H01L 23/3128 257/667 |
| 7,126,829 | B1 | 10/2006 | Yen | |
| 7,511,379 | B1 | 3/2009 | Flint, Jr. | |
| 8,952,516 | B2 | 2/2015 | Zohni | |
| 10,622,289 | B2 | 4/2020 | Zohni | |
| 2002/0131252 | A1 | 9/2002 | Hall | |
| 2008/0303132 | A1 | 12/2008 | Mohammed | |
| 2009/0163047 | A1 | 6/2009 | Jeon | |
| 2013/0083494 | A1 | 4/2013 | Syal | |
| 2020/0150364 | A1* | 5/2020 | Leigh | ................... G02B 6/4292 |

* cited by examiner

*Primary Examiner* — Andargie M Aychillhum
(74) *Attorney, Agent, or Firm* — Lumen Patent Firm

(57) ABSTRACT

3D electrical integration is provided by connecting several component carriers to a single substrate using contacts at the edges of the component carriers making contact to a 2D contact array (e.g., a ball grid array or the like) on the substrate. The resulting integration of components on the component carriers is 3D, thereby providing much higher integration density than in 2D approaches.

7 Claims, 6 Drawing Sheets

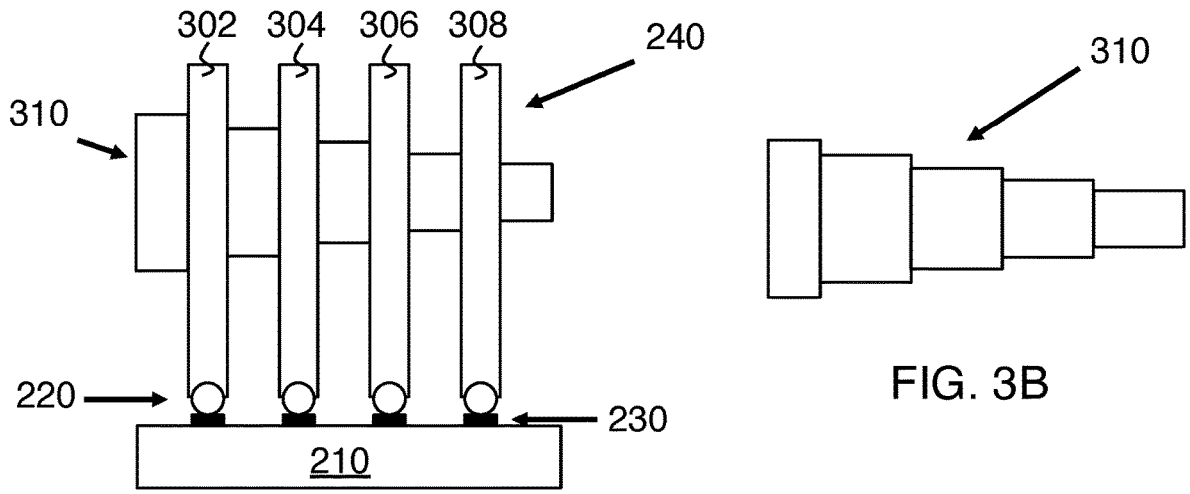
FIG. 3A
FIG. 3B
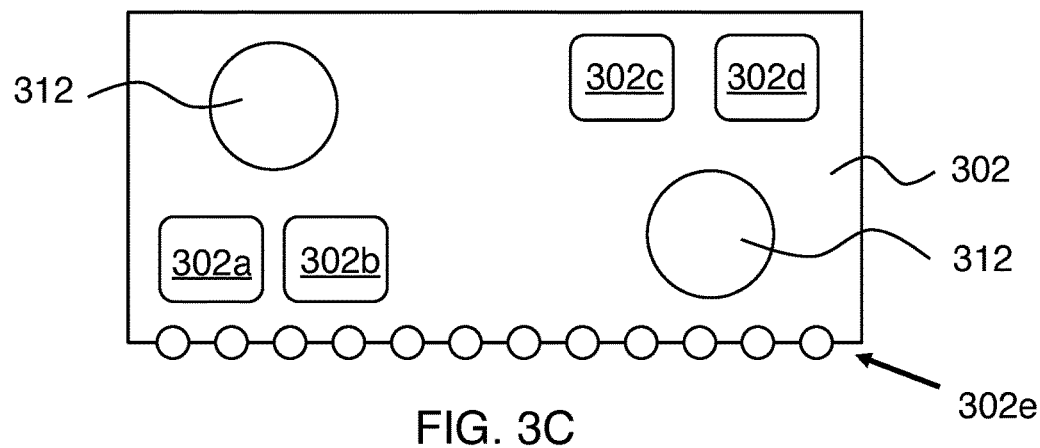
FIG. 3C
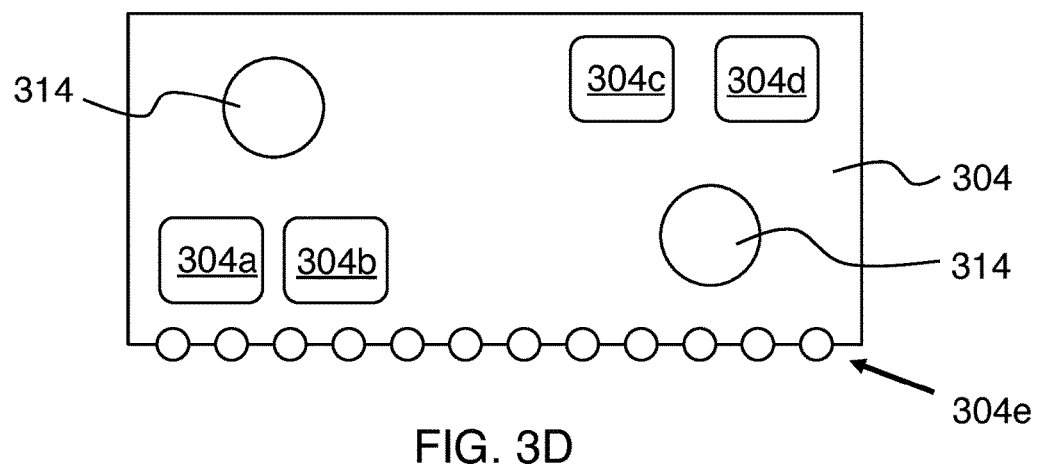
FIG. 3D

3D ELECTRICAL INTEGRATION USING COMPONENT CARRIER EDGE CONNECTIONS TO A 2D CONTACT ARRAY

CROSS REFERENCE TO RELATED APPLICATIONS

This application claims priority from U.S. Provisional Patent Application 63/032,107 filed May 29, 2020, which is incorporated herein by reference.

FIELD OF THE INVENTION

This invention relates to 3D integration of electrical components.

BACKGROUND

A component carrier can be attached to a substrate using a ball grid array (BGA). Conventionally this is done in a 2D manner with a 2D array of contacts on a flat surface of the component carrier making contact to a similar 2D array of contacts on the substrate via the ball grid array. However, this method is subject to damage and doesn't allow for easy rework of itself or other components. Damage resistance can be improved by over-molding a protective structure on top of the component carriers, but this is expensive to setup, has a longer cycle time for new designs, and is not well suited for low volume production runs. Accordingly, it would be an advance in the art to provide improved integration of electrical components to a 2D array of contacts on a substrate.

SUMMARY

The main idea of this work is to connect several component carriers to a single substrate using contacts at the edges of the component carriers making contact to a 2D contact array (e.g., a ball grid array or the like) on the substrate. The resulting integration of components on the component carriers is 3D, thereby providing much higher integration density than in 2D approaches.

Significant advantages are provided. Increased component density can be provided without having to reduce the component size. For example, 12 FETs could now fit in the same area as 8. This approach can provide larger/less fragile/better performing integration relative to a single horizontal component carrier. Standard printed circuit board fab and assembly processes can be used. Increased flexibility is provided. For example, where the components being integrated are switches, we can now simply build modules with a different number of switches and/or change the switch configuration.

Significant features include, but are not limited to:

1) Use of active circuits on vertical component carriers having ball grid array edge contact connected to a common substrate.

2) Use of a variable number of component carriers to make modules with a different number of components.

3) Component configurations can be easily changed—for example, simply with a new component carrier design.

4) Different component configurations can be used within a module to match design requirements.

5) Use of solder balls in a recess for connection of the edge of the component carriers to the main substrate on which the component carriers will be mounted.

6) Use of a stepped pin to provide accurate component carrier spacing within a module.

7) Use of a laminated stack of active component carriers and spacer frames to provide accurate active component carrier spacing within a module.

BRIEF DESCRIPTION OF THE DRAWINGS

FIGS. 3A-F shows use of press fit pins to define the spacing of the stack of component carriers.

DETAILED DESCRIPTION

Figure 1:
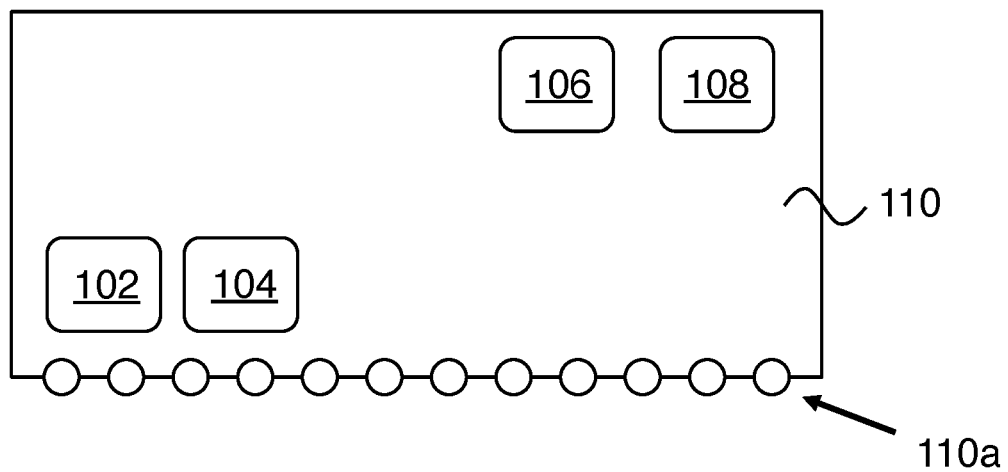
FIG. 1 shows an exemplary component carrier.

FIG. 1 shows a front view of an exemplary component carrier 110. Here 102, 104, 106, 108 are components (e.g., integrated circuits or the like) and 110a is a 1D array of edge contacts connected to the electrical components. These connections are not shown because practice of the invention does not depend on details of the connections between components 102, 104, 106, 108 and edge contacts 110a. An edge contact is an electrical contact disposed on an edge of a component carrier, as opposed to being disposed on its top or bottom surfaces. A component carrier can be a printed circuit board, chip carrier or the like. Preferably, the 1D array of edge contacts 110a is an array of solder balls.

Figure 2A:
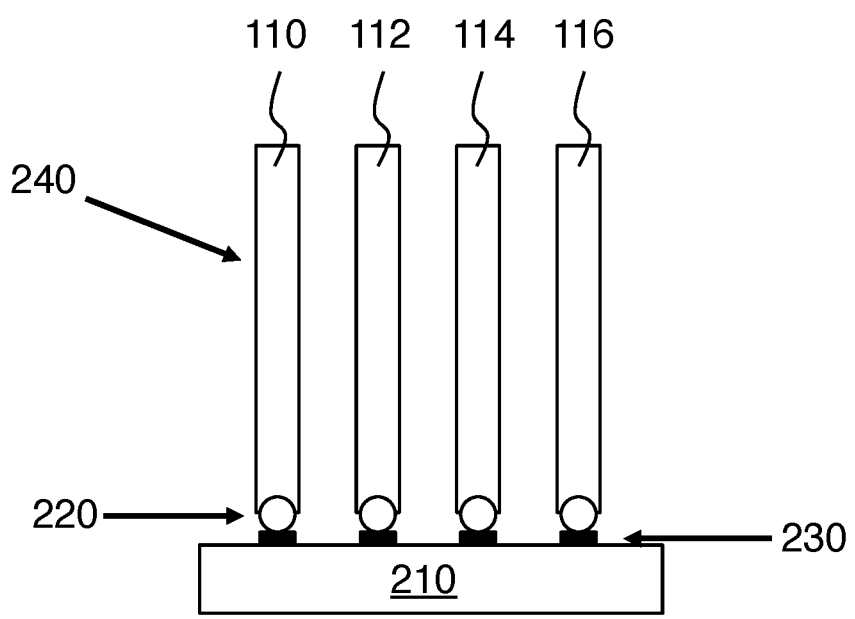
FIG. 2A is a side view of an exemplary embodiment of the invention.

FIG. 2A is a side view of an exemplary embodiment of the invention. This example is an apparatus including two or more component carriers (e.g., 110, 112, 114, 116), where each component carrier has one or more electrical components disposed thereon (e.g., components 102, 104, 106, 108 on component carrier 110 as shown on FIG. 1), and where each component carrier has a 1D array of edge contacts connected to the electrical components (e.g., edge contacts 110a on component carrier 110 as shown on FIG. 1).

The apparatus also includes a substrate 210 having a planar 2D substrate array of contacts 230.

The two or more component carriers are stacked to provide a component carrier stack 240 such that the 1D arrays of edge contacts form a planar 2D component array of contacts 220.

Figure 2B:
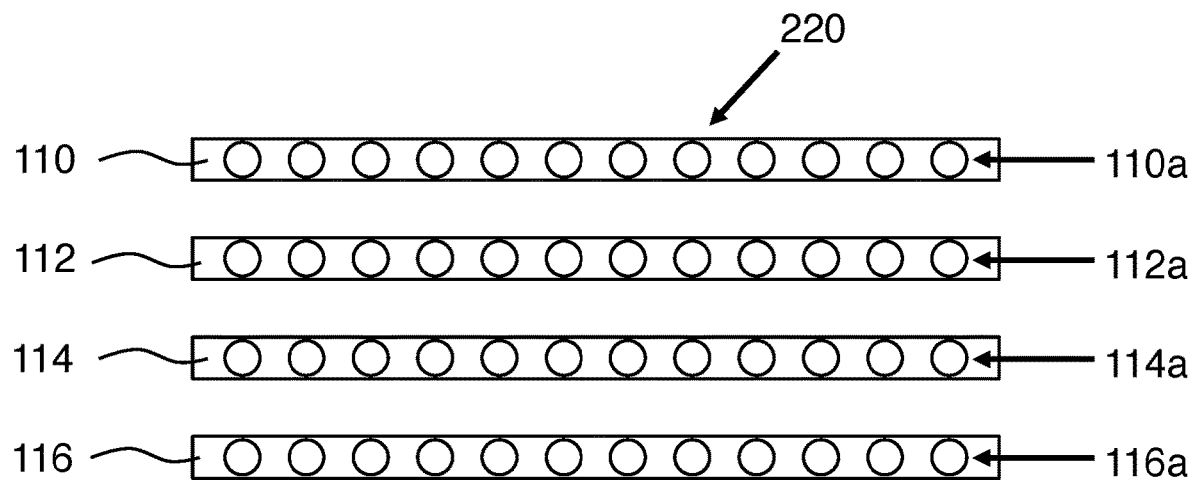
FIG. 2B shows the component array of contacts for the example of FIG. 2A.

FIG. 2B shows a bottom view of planar 2D component array of contacts 220. Here we see that each component carrier 110, 112, 114, 116 has its corresponding 1D array of edge contacts 110a, 112a, 114a, 116a, respectively. The combination of these 1D arrays of edge contacts provides the planar 2D component array of contacts 220.

Figure 2C:
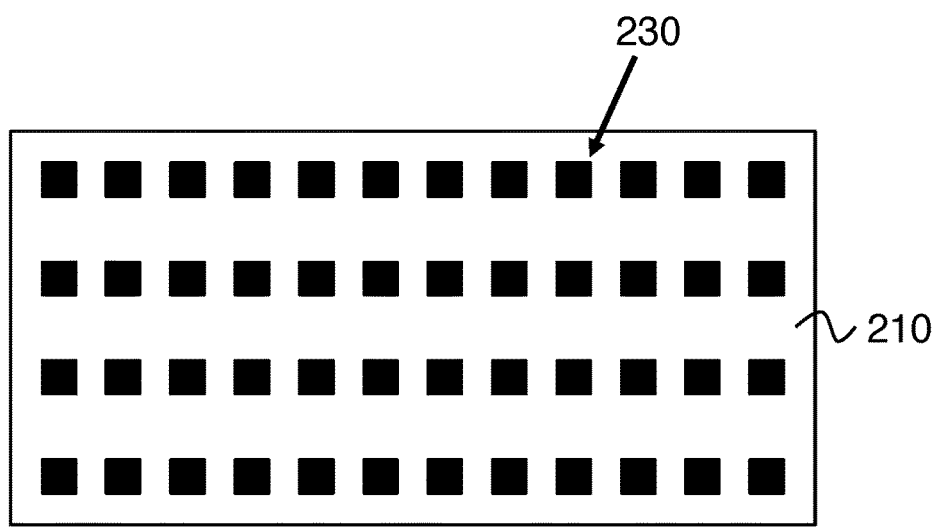
FIG. 2C shows the substrate array of contacts for the example of FIG. 2A.

FIG. 2C shows a top view of planar 2D substrate array of contacts 230 on substrate 210.

The planar 2D component array of contacts 220 has a component contact pattern that matches a substrate contact pattern of the planar 2D substrate array of contacts 230. FIGS. 2B-C schematically show this correspondence, both arrays of contacts having the same pattern.

The planar 2D component array of contacts 220 is bonded to the planar 2D substrate array of contacts 230 such that an electrical connection is made between each corresponding pair of contacts. FIG. 2A shows these connections in a side view. Conventional electrical bonding techniques can be used to perform this bonding.

Each component carrier can have a different circuit. One application is for a FET (field effect transistor) module replacement, where 12 FETs can now be placed in the same area as 8 FETs would occupy with a conventional integration approach.

FIGS. 3A-F shows use of press fit pins to define the spacing of the stack of component carriers. In this example, component carrier stack 240 includes component carriers 302, 304, 306, 308 whose spacing is defined by two or more press fit pins 310. Only one press fit pin is shown in the side view of FIG. 3A for simplicity. Preferably the press fit pins 310 have a diameter that stepwise decreases along a length of the press fit pins, as shown on FIG. 3B.

Figure 3E:
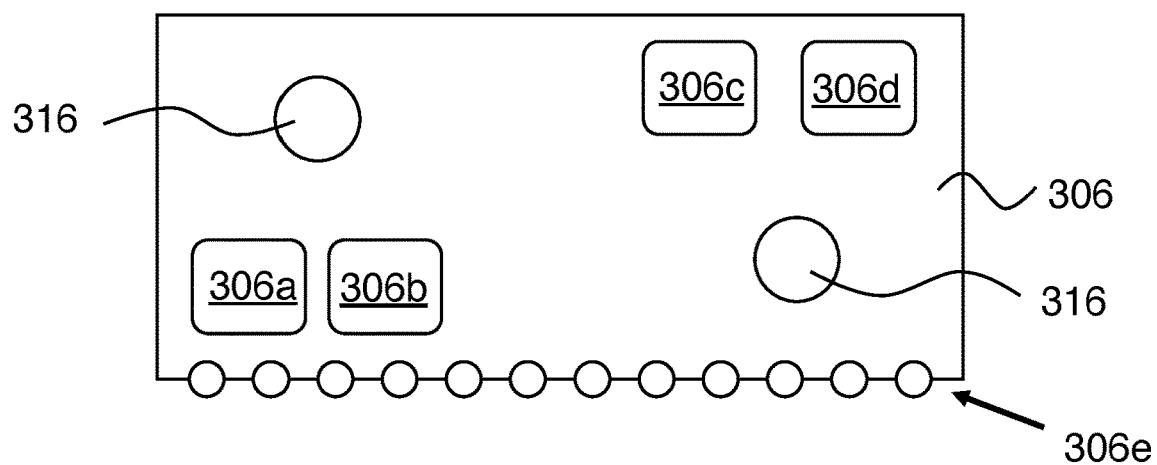
Figure 3F:
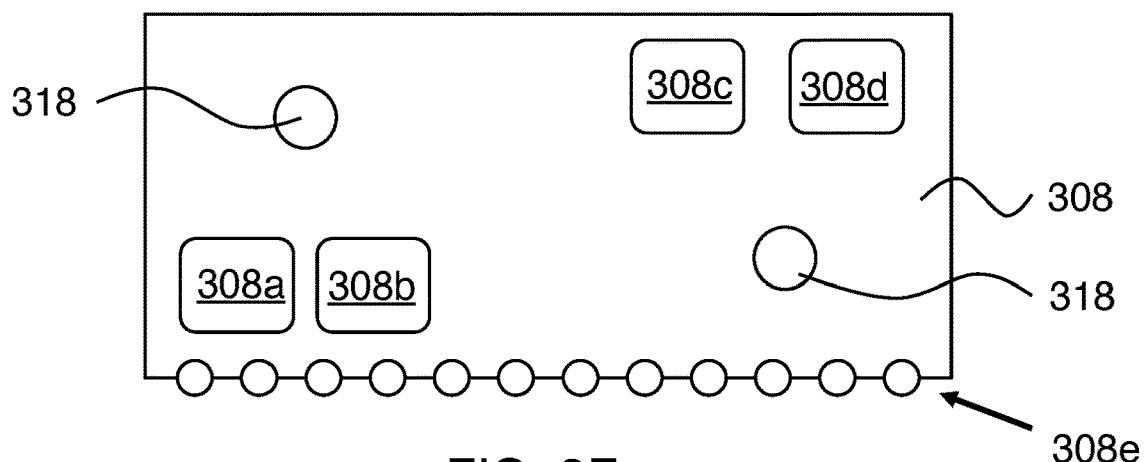

FIGS. 3C, 3D, 3E, 3F show holes 312, 314, 316, 318 respectively that are sized so that press fit pins 310 can define the spacing between component carriers 302, 304, 306, 308 as shown on FIG. 3A. Here components 302a, 302b, 302c, 302d are disposed on component carrier 302. Components 304a, 304b, 304c, 304d are disposed on component carrier 304. Components 306a, 306b, 306c, 306d are disposed on component carrier 306. Components 308a, 308b, 308c, 308d are disposed on component carrier 308. 1D edge contact arrays 302e, 304e, 306e, 308e are disposed on component carriers 302, 304, 306, 308, respectively.

Figure 3G:
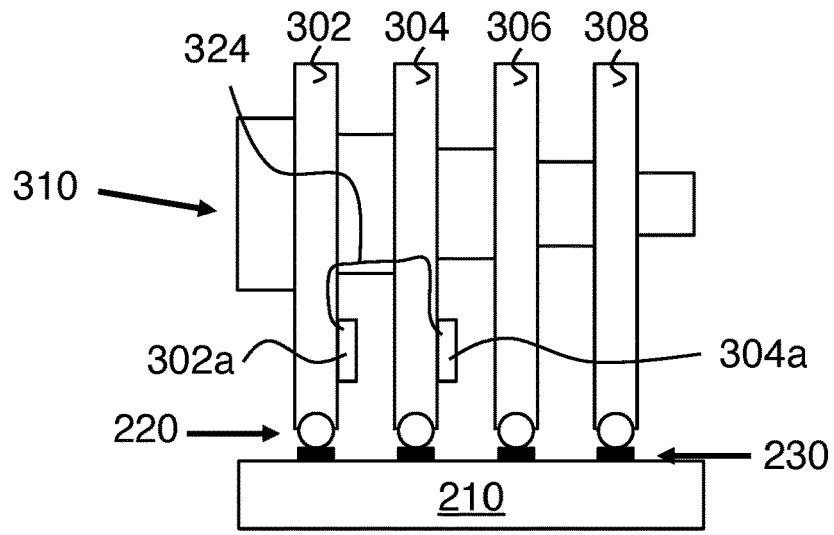
FIG. 3G shows a press fit pin providing an electrical connection between component carriers.

FIG. 3G shows a press fit pin providing an electrical connection between component carriers. In this example, press fit pin 310 provides an electrical connection 324 between component 302a on component carrier 302 and component 304a on component carrier 304. Thus the press fit pins can provide one or more electrical connections between the stacked component carriers in the component carrier stack. The press fit pins can be used for common component carrier to component carrier connections. Conformal coatings or edge sealant can be used to further protect the components.

Figure 4A:
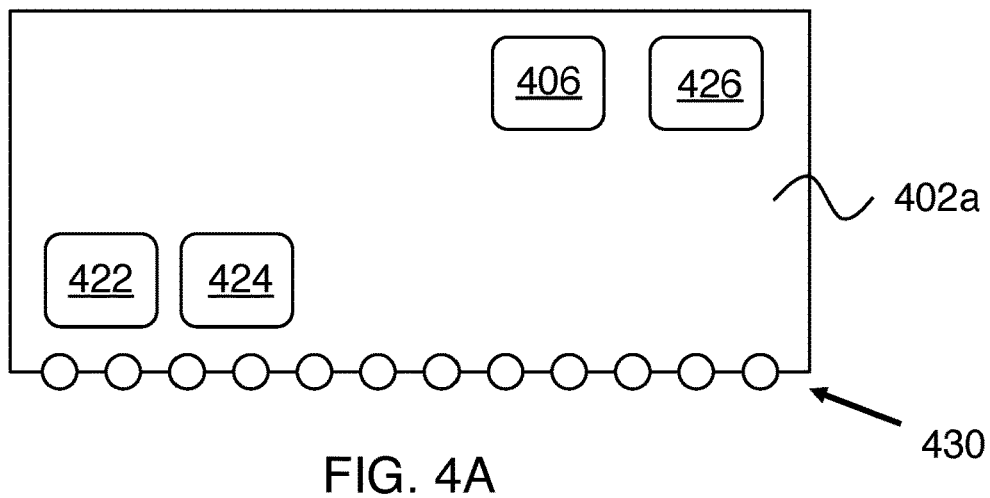
FIGS. 4A-C show use of spacer frames to define the spacing of the stack of component carriers.
Figure 4B:
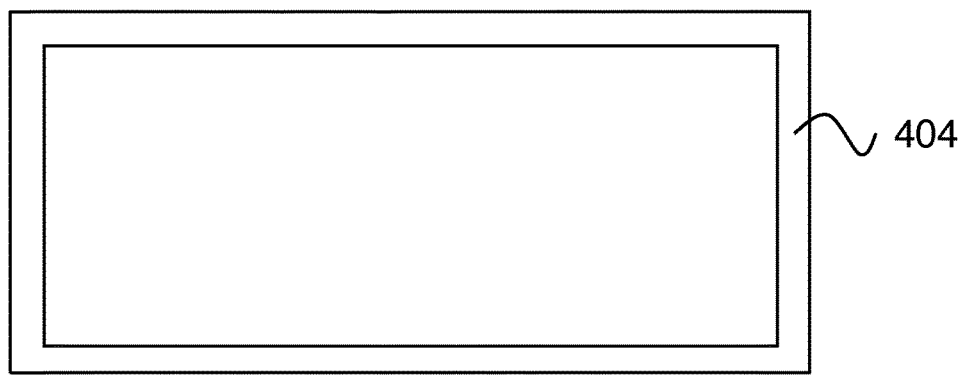
Figure 4C:
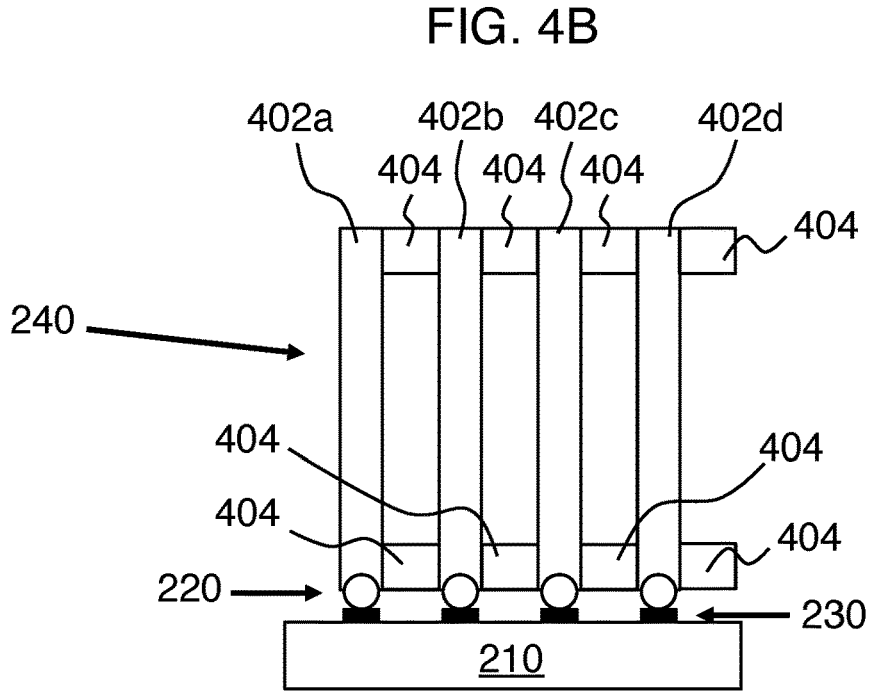

FIGS. 4A-C show use of spacer frames to define the spacing of the stack of component carriers. Here FIG. 4A is a front view of component carrier 402a, FIG. 4B is a front view of a spacer frame 404, and FIG. 4C is a side view of component carrier stack 240. Here components 406, 422, 424, 426 are disposed on component carrier 402a. 1D edge contact array 430 is disposed on component carrier 402a. In this example, component carrier stack 240 is an alternating stack of the component carriers (402a, 402b, 402c, 402d) and spacer frames 404. The components are mounted in cavities between adjacent component carriers. The cavities may need breather holes (see discussion of FIGS. 5A-B below) to avoid excessive pressure buildup when the components are soldered in place. The thicknesses of the spacer frames and the component carriers can be used to define the pitch of the planar 2D component array of contacts 220 in one direction (i.e., the vertical direction on FIG. 2B). If present, an outermost spacer frame (e.g., as shown on the right side of FIG. 4C) can be used as a frame for potting the components that would otherwise be exposed.

Figure 4D:
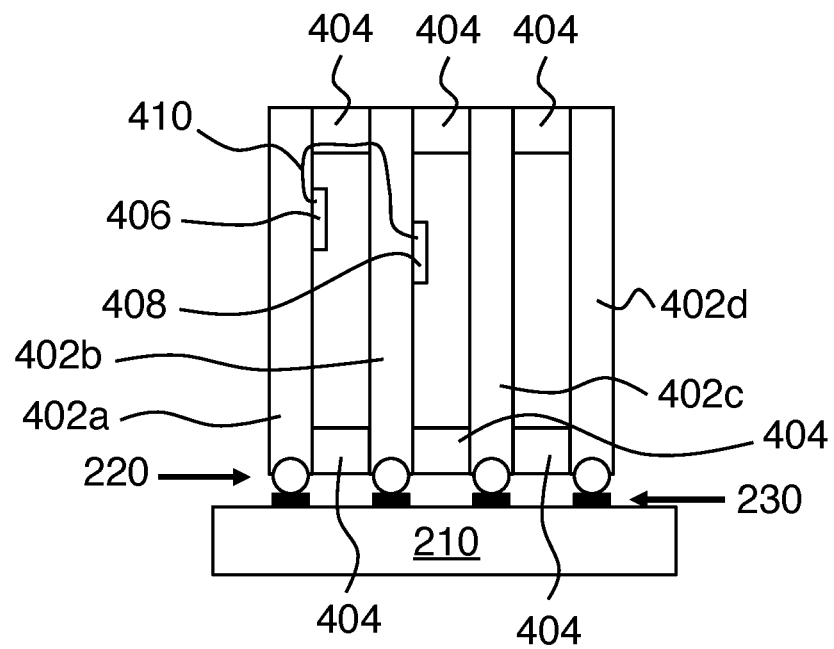
FIG. 4D shows a spacer frame providing an electrical connection between component carriers.

FIG. 4D shows a spacer frame providing an electrical connection between component carriers. In this example, one of the spacer frames 404 provides an electrical connection 410 between component 406 on component carrier 402a and component 408 on component carrier 402b. Thus the spacer frames can provide one or more electrical connections between the stacked component carriers in the component carrier stack.

Figure 5A:
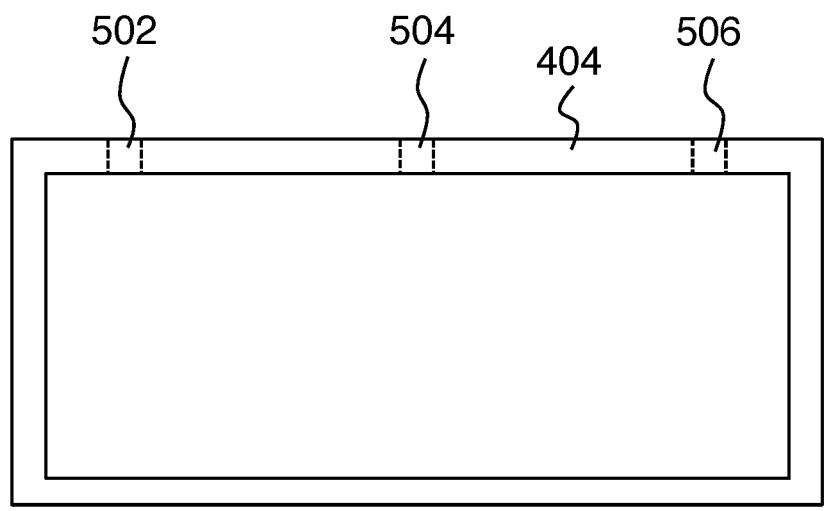
FIGS. 5A-B show a spacer frame having vents.
Figure 5B:
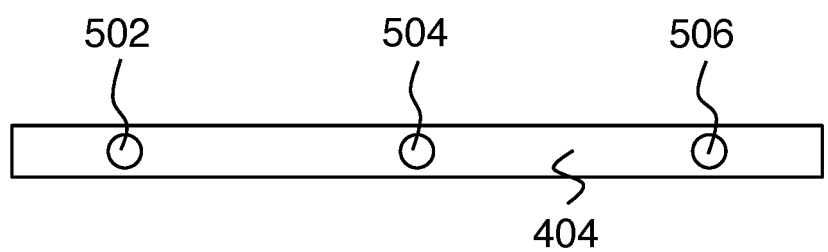

FIGS. 5A-B show a spacer frame having vents. Here spacer frame 404 includes vents 502, 504, 506. Such vents can be configured to prevent excess air pressure within the component carrier stack.

A third way to define the spacing of the component carrier spacing is with component to component carrier contact. In other words, the component carriers are stacked with a spacing directly defined by the heights of the components on the component carriers. The spacer frame and press fit pin approaches described above have the advantage of providing component carrier spacing that is independent of the sizes of the components on the component carriers.

The invention claimed is:

1. Apparatus comprising:
two or more component carriers, wherein each of the two or more component carriers has one or more electrical components disposed thereon, and wherein each of the two or more component carriers has a 1D array of edge contacts connected to the electrical components;
wherein the edge contacts are electrical contacts disposed on edges of the two or more component carriers;
a substrate having a planar 2D substrate array of contacts;
wherein the two or more component carriers are stacked to provide a component carrier stack such that the 1D arrays of edge contacts form a planar 2D component array of contacts;
wherein the planar 2D component array of contacts has a component contact pattern that matches a substrate contact pattern of the planar 2D substrate array of contacts;
wherein the planar 2D component array of contacts is bonded to the planar 2D substrate array of contacts such that an electrical connection is made between each corresponding pair of contacts, further comprising two or more press fit pins configured to define a spacing of the stacked component carriers in the component carrier stack, wherein two or more press fit pin is attached perpendicularly to each of the two or more stacked component carriers.

2. The apparatus of claim 1, wherein the press fit pins have a diameter that stepwise decreases along a length of the press fit pins.

3. The apparatus of claim 1, wherein the press fit pins provide one or more electrical connections between the stacked component carriers in the component carrier stack.

4. The apparatus of claim 1, further comprising one or more spacer frames, wherein the component carrier stack is an alternating stack of the component carriers and the spacer frames.

5. The apparatus of claim 4, wherein the spacer frames provide one or more electrical connections between the component carriers.

6. The apparatus of claim 4, wherein at least one of the spacer frames includes one or more vents configured to prevent excess air pressure within the component carrier stack.

7. The apparatus of claim 1, wherein the 1D arrays of edge contacts comprise solder balls.

* * * * *